United States Patent
Fatemizadeh et al.

(10) Patent No.: US 7,049,677 B2
(45) Date of Patent: May 23, 2006

(54) LOW COST DIELECTRIC ISOLATION METHOD FOR INTEGRATION OF VERTICAL POWER MOSFET AND LATERAL DRIVER DEVICES

(75) Inventors: Badredin Fatemizadeh, San Jose, CA (US); Ali Salih, Mesa, AZ (US)

(73) Assignee: Power-One, Inc., Camarillo, CA (US)

( * ) Notice: Subject to any disclaimer, the term of this patent is extended or adjusted under 35 U.S.C. 154(b) by 67 days.

(21) Appl. No.: 10/767,384

(22) Filed: Jan. 28, 2004

(65) Prior Publication Data

US 2005/0161764 A1 Jul. 28, 2005

(51) Int. Cl.
*H01L 29/00* (2006.01)

(52) U.S. Cl. .......................... 257/510; 257/93; 257/374; 257/564; 257/397; 257/501; 257/506; 438/353; 438/219; 438/294

(58) Field of Classification Search .................. None
See application file for complete search history.

(56) References Cited

U.S. PATENT DOCUMENTS 5,369,309 A * 11/1994 Bacrania et al. ............. 327/94
6,225,664 B1 * 5/2001 Endo et al. ................. 257/347
6,269,011 B1 * 7/2001 Ohshima ..................... 363/50

* cited by examiner

*Primary Examiner*—Nathan J. Flynn
*Assistant Examiner*—Scott R Wilson
(74) *Attorney, Agent, or Firm*—Robert D. Atkins; Quarles & Brady Stretch Lang LLP (57) ABSTRACT

A semiconductor device has a driver device (10) in proximity to a power device (12). In making the semiconductor device, an N+ layer (24) is formed on a substrate (22). A portion of the N+ layer is removed, substantially down to the substrate, to provide a layer offset (28) between the driver device area and power device area. An epi region of uniform thickness is formed over the driver device and power device areas. A portion of the epi layer is removed to provide another layer offset (70). An oxide layer (68) of uniform thickness is formed over the epi region. The oxide layer is planarized to remove oxide layer over the N+ layer. An oxide-filled trench (80) is formed between the driver device and the power device. The oxide-filled trench extends down to the oxide layer to isolate the driver device from the power device.

16 Claims, 6 Drawing Sheets

LOW COST DIELECTRIC ISOLATION METHOD FOR INTEGRATION OF VERTICAL POWER MOSFET AND LATERAL DRIVER DEVICES

CROSS REFERENCE TO RELATED PATENT APPLICATIONS

The present patent application is related to copending U.S. patent application Ser. No. 10/753,030, filed Jan. 6, 2004, entitled "Selective Epi-Region Method for Integration of Vertical Power MOSFET and Lateral Driver Devices" and filed by Badredin Fatemizadeh et al.

FIELD OF THE INVENTION

The present invention relates in general to semiconductor devices and, more particularly, to a dielectric isolation method for integration of power MOSFET and lateral driver device.

BACKGROUND OF THE INVENTION

Metal oxide semiconductor field effect transistors (MOSFETs) are commonly used in power transistor applications such as switching power supplies, power conversion, power management, energy systems, telecommunications, personal computer applications, motor control, automotive, and consumer electronics. Power devices generally refer to transistors and other semiconductor devices that are capable of switching about 1.0 ampere or more of conduction current. Power MOSFETs are well known as high input impedance, voltage-controlled devices which require a relatively small charge to initiate turn-on from simple drive circuitry. The power MOSFET ideally exhibits high drain-to-source current carrying capacity, low drain-to-source resistance ($R_{DSon}$) to reduce conduction losses, high switching rate with low switching losses, and high safe operating range (SOA) which provides the ability to withstand a combination of high voltage and high current.

Power MOSFETs are often vertical devices used in combination with a lateral driver circuit. The driver circuit may be as simple as a p-channel transistor and an n-channel transistor connected in a totem-pole arrangement. Other driver circuits are known to have additional features. The junction between the drain of the p-channel transistor and the drain of the n-channel transistor is the output of the driver circuit, which is coupled to the gate of the power MOSFET. In one operating mode, the p-channel transistor of the driver circuit is turned on to source current directly into the gate of the power MOSFET. In another operating mode, the n-channel transistor of the driver circuit is turned on to sink current directly away from the gate of the power MOSFET. The driver circuit must supply sufficient current to charge and discharge the gate voltage of the power MOSFET. The driver circuit thus operates to turn on and off the power MOSFET in a rapid and efficient manner.

The driver circuit is typically a low voltage device, operating in the range of 5–25 volts. The power MOSFET is a higher voltage device, operating in the range of 20–30 volts. The lateral driver circuit is usually placed on the same base silicon substrate as the power device. For efficient layout considerations, the lateral driver circuit is often located in proximity to the power MOSFET.

In constructing the lateral devices, an N-epi layer is disposed above the silicon substrate. A first p-well is formed in the N-epi layer for the n-channel transistor, and an n-well is formed within the first p-well for the p-channel transistor. A second p-well is also formed in the N-epi layer for the power device. The second p-well is located in proximity to but separated from the first p-well by an N-epi region.

Depending on the operating voltage and operating frequency of the power device, the lateral driver circuit may be subject to junction leakage in the form of carrier injection from the power device. The lateral driver circuit can also be subjected to switching noise from power device. The first and second p-wells are separated by N-epi, which form a PN junction. The PN junction ideally provides isolation, but can become forward biased in certain circumstances. Any conduction between the power MOSFET and driver circuit could be problematic or detrimental to the operation of the IC.

A need exists to maintain isolation between the power MOSFET and the lateral driver circuit.

SUMMARY OF THE INVENTION

In one embodiment, the present invention is a method of forming a semiconductor device comprising the steps of providing a substrate, forming a first layer of semiconductor material over the substrate, removing a portion of the first layer to provide a layer offset between a removed portion of the first layer and a remaining portion of the first layer, forming an oxide layer of uniform thickness over the removed portion of the first layer and the remaining portion of the first layer, planarizing the oxide layer so that the oxide layer over the remaining portion of the first layer is removed, forming a polysilicon region over the planarized oxide layer, forming an epi region over the remaining portion of the first layer, forming a trench between the polysilicon region and the epi region extending vertically down to the oxide layer, and depositing oxide in the trench down to the oxide layer to isolate the polysilicon region.

In another aspect, the present invention is a method of forming an integrated circuit having a driver device in proximity to a power device comprising the steps of forming an oxide layer below the driver device, forming a trench between the driver device and the power device, wherein the trench extends down to the oxide layer, and depositing oxide in the trench down to the oxide layer to isolate the driver device from the power device.

In yet another aspect, the present invention is a semiconductor device having a driver device in proximity to a power device. The semiconductor device is made by the process comprising the steps of forming an oxide layer below the driver device, forming a trench between the driver device and the power device, wherein the trench extends down to the oxide layer, and depositing oxide in the trench down to the oxide layer to isolate the driver device from the power device.

In yet another aspect, the present invention is a semiconductor device comprising a first semiconductor device. A second semiconductor device is physically proximate and electrically coupled to the first semiconductor device. An oxide layer is disposed below the first semiconductor device. An oxide-filled trench is disposed between the first and second semiconductor devices. The oxide-filled trench extends down to the oxide layer to provide isolation between the first and second semiconductor devices.

DETAILED DESCRIPTION OF THE DRAWINGS

Figure 1:
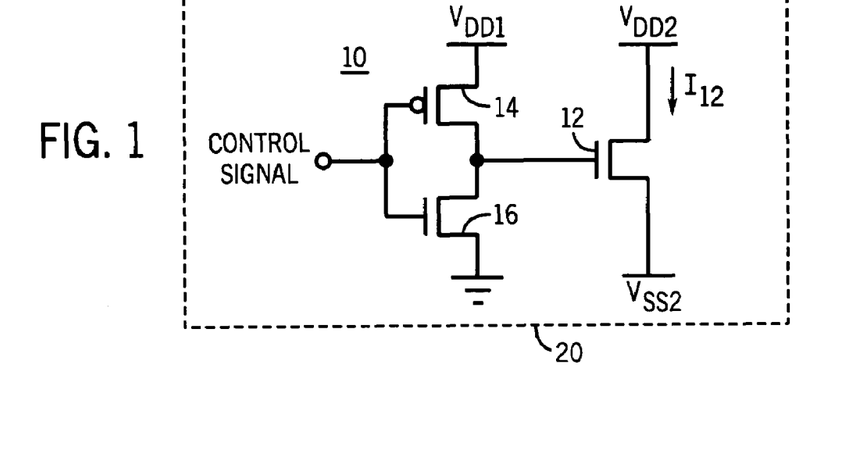
FIG. 1 is a schematic diagram of a driver circuit and power MOSFET.

Referring to FIG. 1, driver circuit 10 is shown with an output coupled to the gate of power MOSFET 12. Driver circuit 10 and power MOSFET 12 are formed in proximity to one another on a single silicon substrate and packaged as an integrated circuit (IC) 20. IC 20 may contain other signal processing circuitry. The IC containing power MOSFET 12 is commonly used in power transistor applications such as switching power supplies, power conversion, power management, energy systems, telecommunications, personal computer applications, motor control, automotive, and consumer electronics.

Driver circuit 10 must supply sufficient current to charge and discharge the gate voltage of power MOSFET 12. Power MOSFET 12 is capable of switching more than 1.0 ampere of conduction current $I_{12}$. Power MOSFET 12 exhibits high drain-to-source current carrying capacity, low drain-to-source resistance ($R_{DSon}$) to reduce conduction losses, high switching rate with low switching losses, and high safe operating range (SOA) which provides the ability to withstand a combination of high voltage and high current.

Driver circuit 10 includes p-channel transistor 14 and n-channel transistor 16. A control signal is applied to the common gates of transistors 14 and 16. If the control signal is low, then transistor 14 conducts and transistor 16 is turned off. Transistor 14 sources current to the gate of power MOSFET 12 to turn on the power device in a rapid manner. If the control signal is high, then transistor 14 turns off and transistor 16 conducts. Transistor 16 sinks current away from the gate of power MOSFET 12 to turn off the power device in a rapid manner.

Driver circuit 10 operates with a low supply voltage $V_{DD1}$ on the order of 5–25 volts and ground potential. Power MOSFET 12 operates with a higher supply voltage $V_{DD2}$ in the range of 20–30 volts or more, and supply voltage $V_{SS2}$. As noted above, driver circuit 10 and power MOSFET 12 are formed in proximity to one another on the same silicon substrate within IC 20. Depending on the operating voltage and operating frequency of power MOSFET 12, driver circuit 10 may be subjected to parasitic components and junction leakage in the form of carrier injection from the power device. The lateral driver circuit 10 can also be subjected to switching noise from power MOSFET 12. In general, the lateral devices of driver circuit 10 will require isolation and protection from the higher operating voltage of power MOSFET 12.

Figure 2:
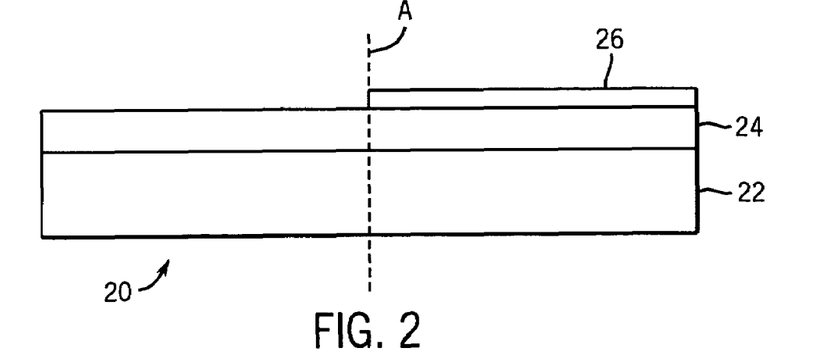
FIGS. 2–7 illustrate cross-sectional views of a first embodiment of the driver circuit and power MOSFET device.

Turning to FIG. 2, a cross-sectional view of IC 20 is shown. Line A marks the boundary between the lateral driver device area, i.e., where driver circuit 10 is to be formed, and the vertical power device area, i.e., where power MOSFET 12 is to be formed. IC 20 includes silicon substrate 22 having an N+ doping concentration. Substrate 22 is doped with N-type semiconductor material such as phosphorus or arsenic at a concentration level of 1*E20 atoms/centimeter (cm)$^3$. Substrate 22 is about 200–250 microns in thickness. Substrate 22 provides structural support for IC 20 and forms the drain of the vertical power MOSFET 12. N+ layer 24 is disposed over substrate 22. N+ layer 24 has a thickness of about 2 microns and is doped with N-type semiconductor material on the order of 1*E19 phosphorus or arsenic atoms/cm$^3$.

In one aspect, N+ layer 24 can be a separate semiconductor layer with respect to substrate 22. In another aspect, N+ layer 24 functions as an extension of, and can be considered an integral part of, substrate 22. In another embodiment, the area defined by substrate 22 and N+ layer 24 can be a single uniform-concentration substrate region. In another view, N+ layer 24 can be omitted altogether.

Figure 3:
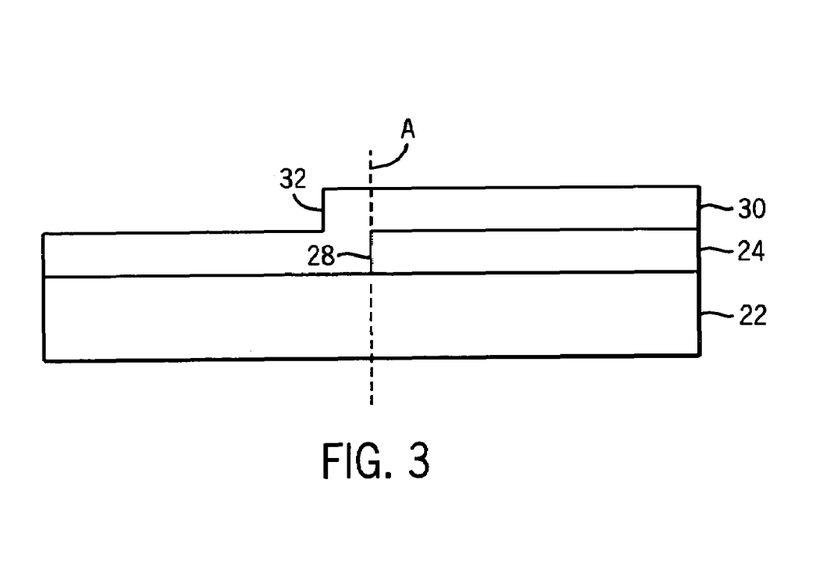

Mask layer 26 is disposed over a portion of N+ layer 24 corresponding to the vertical power device area, i.e., that area to the right of line A. The portion of N+ layer 24 corresponding to the lateral driver device area, i.e., that area to the left of line A, is unprotected in the subsequent etching process. With mask layer 26 in place, the portion of N+ layer 24, which is under the lateral driver device area, is etched away substantially down to substrate 22. Mask layer 26 is then removed as shown in FIG. 3. After the etching process, there is a 2-micron offset or stair-step 28 between substrate 22 and N+ layer 24 at the boundary between the lateral driver device area and the vertical power MOSFET area.

The portion of N+ layer 24 that has been etched away constitutes the removed portion of N+ layer 24. The portion of N+ layer 24 that had been under mask layer 26 constitutes the remaining portion of N+ layer 24. The etching process may be stopped before reaching substrate 22, may be stopped at substrate 22, or may continue into substrate 22. The height of offset 28 is thus determined by the original thickness of N+ layer 24, and the degree or amount of etching that takes place, all of which can be controlled by the design and manufacturing process.

An oxide layer 30 having dielectric properties is grown or formed to a relatively uniform thickness of about 1–2 microns across substrate 22 and N+ layer 24. The thickness of oxide layer 30 above substrate 22 to the left of line A is approximately the same as the thickness of oxide layer 30 above N+ layer 24 to the right of line A. In the process of growing oxide layer 30, the offset or stair-step 28 between substrate 22 and N+ layer 24 causes a similar offset or stair-step 32 in oxide layer 30 as shown. The offset 32 may be a step function, gradual, angled, or inclined, with a linear or non-linear slope.

Figure 4:
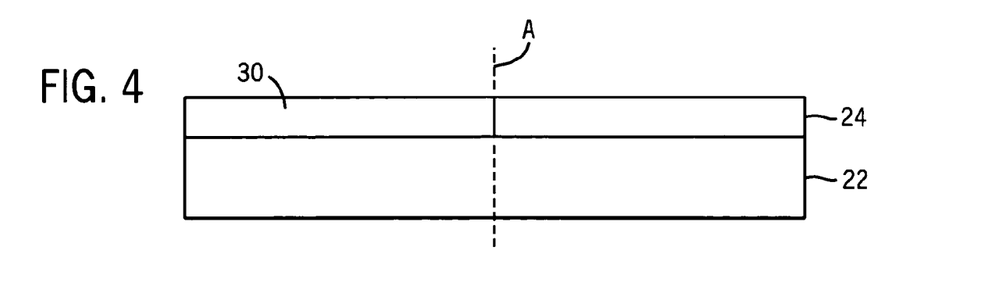

Oxide layer 30 is planarized in FIG. 4 with etch-back and polish steps to create a flat or even surface across the lateral driver device area and the vertical power device area, i.e., on both sides of line A. In the step of planarizing oxide layer 30, the oxide to the right of line A is completely removed. There is no oxide in the vertical power device area to the right of line A because any oxide under power MOSFET 12 could adversely effect the operation of the vertical power device.

Figure 5:
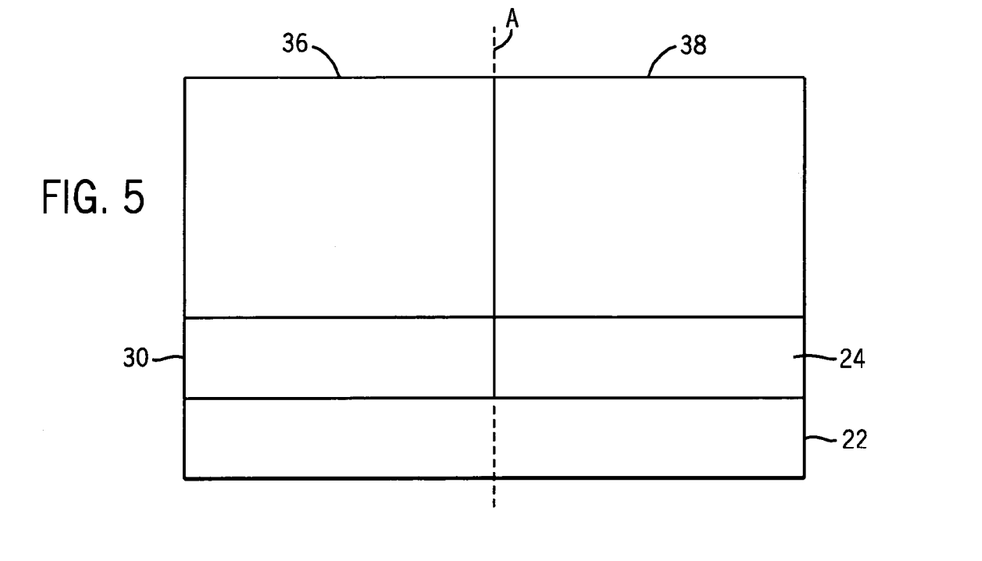

In FIG. 5, an N-type semiconductor region is grown or formed to a relatively uniform thickness of about 4–6 microns across oxide layer 30 and N+ layer 24. The N-type semiconductor region receives an N– doping concentration of phosphorus or arsenic on the order of 5*E15 to 5*E16 atoms/cm$^3$. The N-type semiconductor region over oxide layer 30 becomes polysilicon region 36. The N-type semiconductor region over N+ layer 24 becomes epi layer 38.

Polysilicon region 36 undergoes re-crystallization process such as zone melting re-crystallization (ZMR) in which the polysilicon is annealed to melt the silicon. The polysilicon re-crystallizes as a single crystalline region. Semiconductor devices formed in region 36 can be either poly-crystalline or mono-crystalline. For example, thin film transistors (TFT) may be used for driver circuit 10 in both poly and mono-crystalline form.

Figure 6:
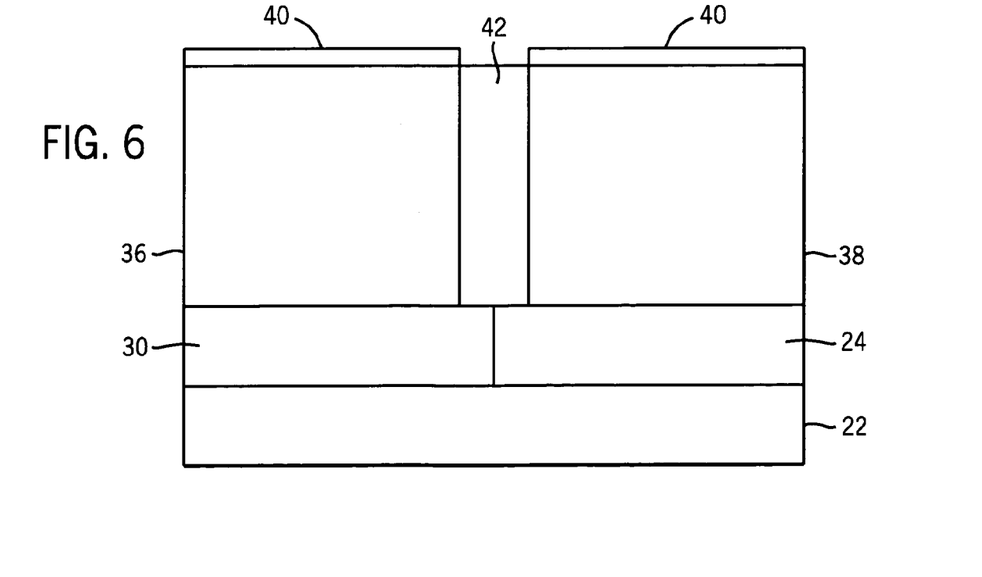

In FIG. 6, mask layer 40 is disposed over the re-crystallized polysilicon region 36 and N-epi region 38 with an opening for trench 42. Trench 42 is formed around the lateral driver device area by an etching process which extends vertically down to oxide layer 30. In one embodiment, trench 42 overlaps line A. That is, trench 42 is formed in both the lateral driver device area and vertical power device area to overlap oxide layer 30 and N+ layer 24. In another embodiment, trench 42 is formed entirely in the lateral driver device area, extending down to oxide layer 30. Trench 42 is filled with oxide. The oxide-filled trench 42 is continuous with oxide layer 30. Accordingly, the combination of oxide layer 30 and oxide-filled trench 42 completely surrounds and provides dielectric isolation for the lateral driver device area from the electrical effects of power MOSFET 12. The oxide barrier provides isolation from parasitic components, carrier injection, and noise immunity for driver circuit 10. The dielectric isolation of oxide layer 30 and oxide-filled trench 42 also provides a thermal barrier against the heat generated by power MOSFET 12.

Figure 7:
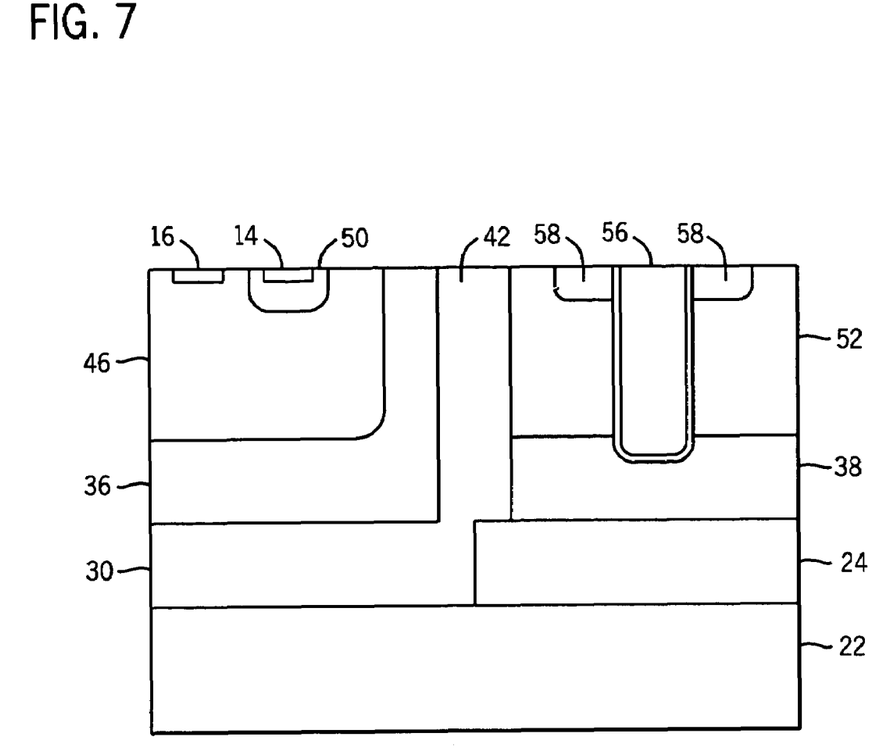

In FIG. 7, p-well 46 is implanted in polysilicon region 36 in the lateral driver device area for driver circuit 10. N-channel transistor 16 is formed in p-well 46. An N-well 50 is implanted in p-well 46 for p-channel transistor 14. P-well 46 has a doping concentration on the order of 1*E16 to 5*E17 boron atoms/cm$^3$. A p-well 52 is implanted in N-epi region 38 in the vertical power device area for power MOSFET 12. P-well 52 has a doping concentration on the order of 1*E17 to 5*E17 boron atoms/cm$^3$. A trench 56 is formed for the gate of power MOSFET 12 and source regions 58 are formed on both sides of trench 56. Substrate 22 is the drain of power MOSFET 12. When driver circuit 10 charges the gate of power MOSFET 12, a conduction path for current $I_{12}$ is created from source regions 58, vertically along trench 56, to the drain in substrate 22. Although power MOSFET 12 is shown as a vertical device, the power MOSFET can be formed as a lateral device.

It can be seen in FIG. 7 that the combination of oxide layer 30 and oxide-filled trench 42 surrounds polysilicon region 36, p-well 46, and lateral driver circuit 10. The oxide barrier formed by oxide layer 30 and oxide-filled trench 42 provides dielectric isolation for transistors 14 and 16 in driver circuit 10 from the electrical effects of power MOSFET 12. The oxide barrier prevents carrier injection and parasitic components into the lateral driver device area and isolates switching noise and heat generated by power MOSFET 12.

An alternate embodiment of IC 20 is shown in FIGS. 8–12. Returning to FIG. 2 as a starting point, the alternate embodiment begins with silicon substrate 22 overlaid with N+ layer 24. Mask layer 26 is disposed over a portion of N+ layer 24 and a portion of N+ layer 24 corresponding to the lateral driver device area, i.e., that area to the left of line A, is etched away, substantially down to substrate 22.

Figure 8:
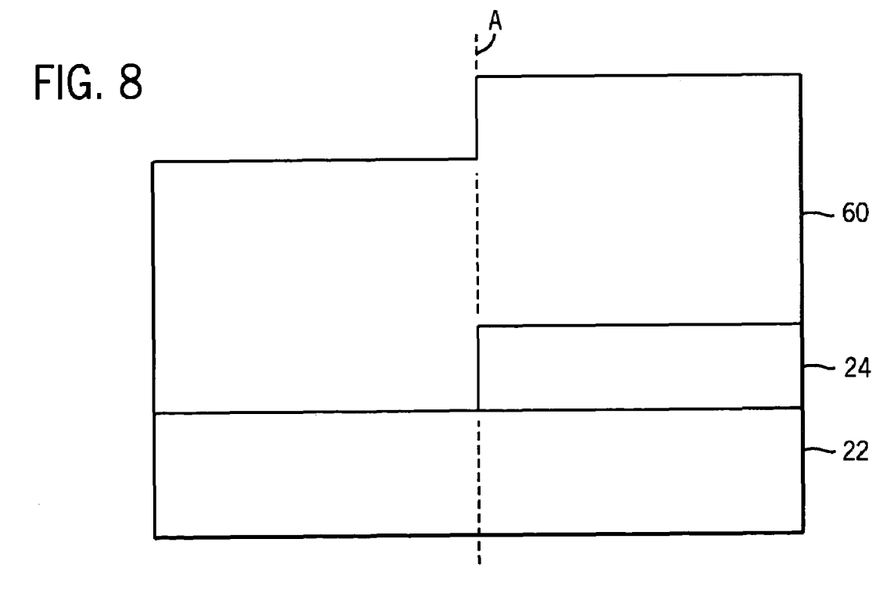
FIGS. 8–12 illustrate cross-sectional views of a second embodiment of the driver circuit and power MOSFET device.

In FIG. 8, mask layer 26 is removed and an epi layer 60 is formed to a relatively uniform thickness of about 6 microns across substrate 22 and N+ layer 24. The thickness of epi layer 60 above substrate 22 to the left of line A is approximately the same as the thickness of epi layer 60 above N+ layer 24 to the right of line A. In the process of forming N-epi layer 60, the offset or stair-step between substrate 22 and N+ layer 24 causes a similar offset or stair-step to N-epi layer 60, as shown.

Figure 9:
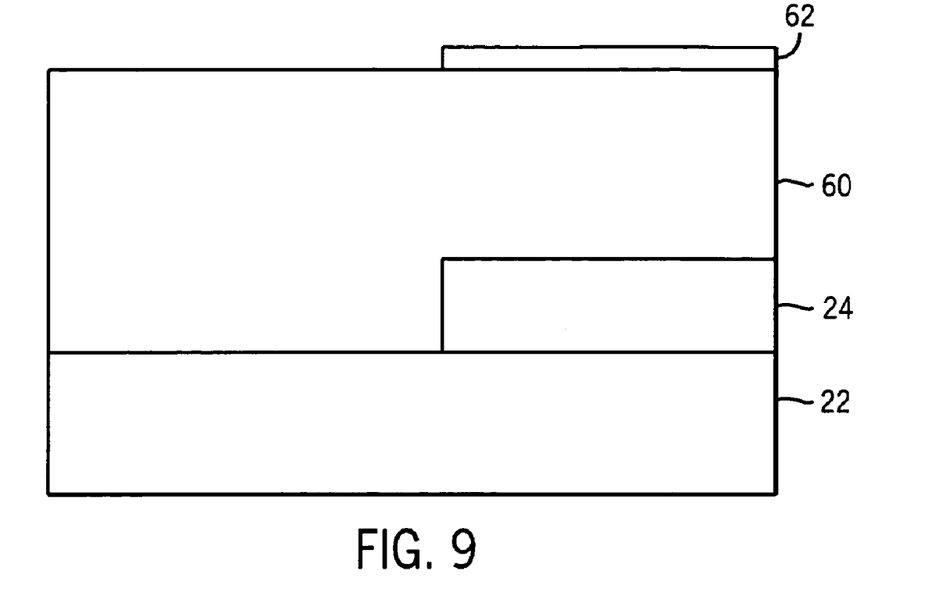

N-epi layer 60 is planarized in FIG. 9 with etch-back and polish steps to create a flat or even surface across the lateral driver device area and the vertical power device area. A mask layer 62 is placed over the planar surface of N-epi layer 60 in order to form another offset or stair-step in N-epi layer 60 by etching away the area unprotected by mask layer 62.

Figure 10:
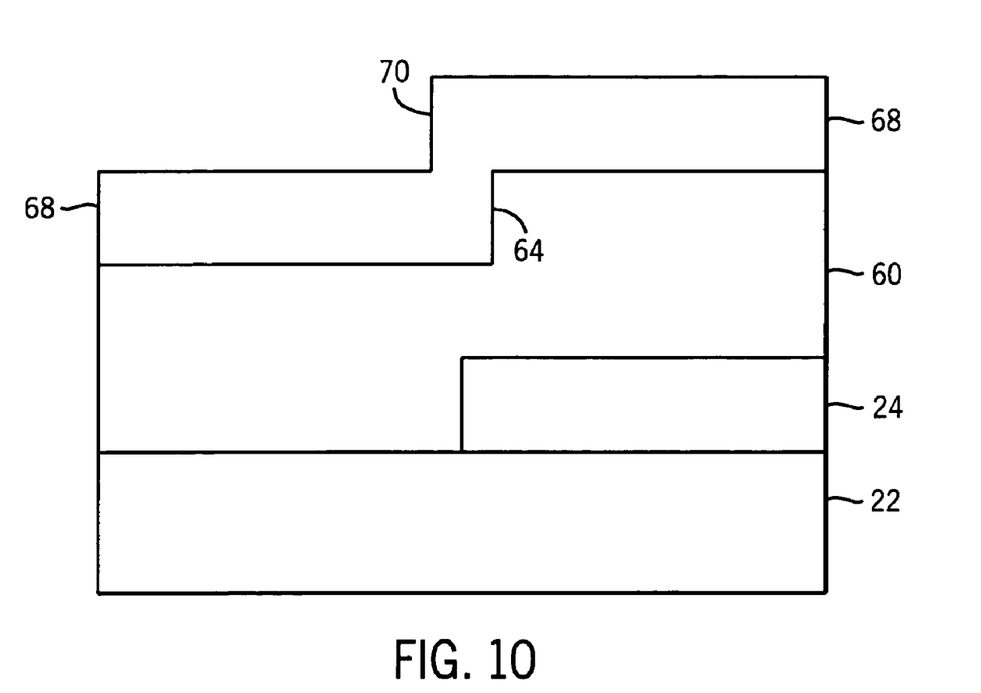

The resulting offset or stair-step 64 in N-epi layer 60 is shown in FIG. 10. Mask layer 62 is removed and oxide layer 68 is grown or formed to a relatively uniform thickness of about 1–2 microns across N-epi layer 60. The thickness of oxide layer 68 below the lateral driver device area is approximately the same as the thickness of oxide layer 68 below the vertical power device area. In the process of growing oxide layer 68, the offset or stair-step 64 causes a similar offset or stair-step 70 in oxide layer 68 as shown.

Figure 11:
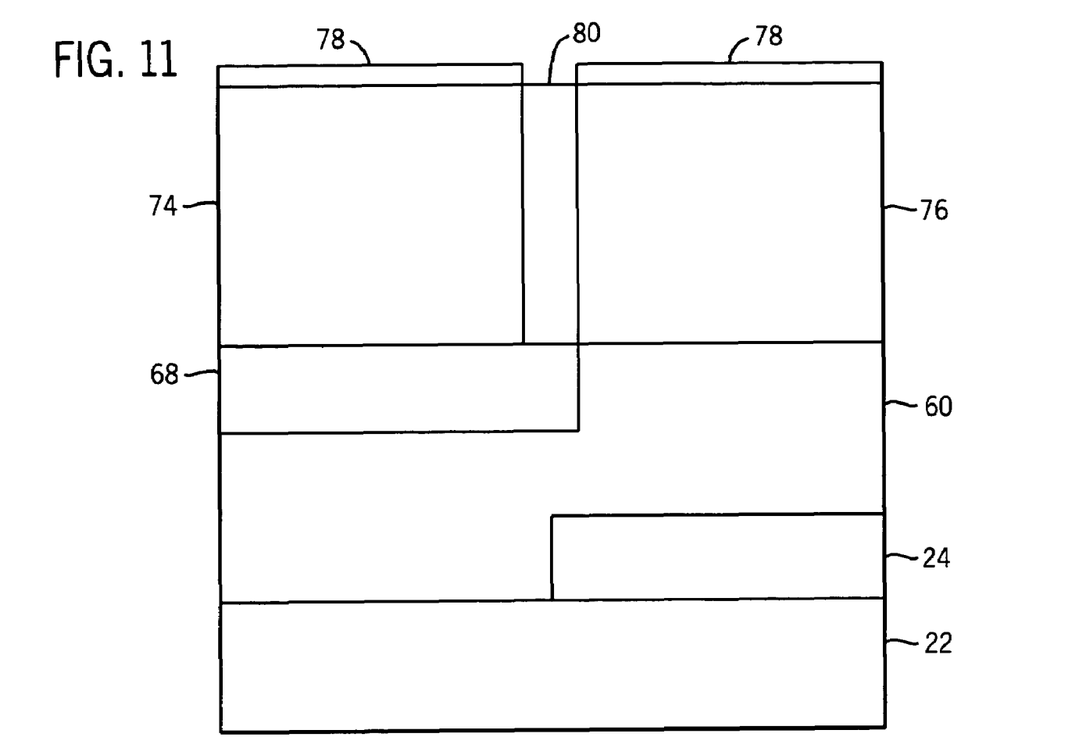

Oxide layer 68 is planarized in FIG. 11 with etch-back and polish steps to create a flat or even surface across the lateral driver device area and the vertical power device area. In the step of planarizing oxide layer 68, the oxide above the vertical power device area is completely removed. An N-type semiconductor region is formed to a relatively uniform thickness of about 4–6 microns across oxide layer 68 and N-epi layer 60. The N-type semiconductor region receives an N-doping concentration of phosphorus or arsenic on the order of 5*E15 to 5*E16 atoms/cm$^3$. The N-type semiconductor region over oxide layer 68 becomes polysilicon region 74. The N-type semiconductor region over N-epi layer 60 becomes epi layer 76. Polysilicon region 74 undergoes re-crystallization process such as ZMR to re-crystallize the polysilicon as a single crystalline region.

Mask layer 78 is disposed on the re-crystallized polysilicon region 74 and N-epi region 76 with an opening for trench 80. Trench 80 is formed around the lateral driver device area by an etching process extending vertically down to oxide layer 68. Trench 80 is filled with oxide. The oxide-filled trench 80 is continuous with oxide layer 68. Accordingly, the combination of oxide layer 68 and oxide-filled trench 80 completely surrounds and isolates the lateral driver device area from the electrical effects of power MOSFET 12. The oxide barrier provides isolation from carrier injection, parasitic components, and noise immunity for driver circuit 10. The dielectric isolation of oxide layer 68 and oxide-filled trench 80 also provides a thermal barrier against the heat generated by power MOSFET 12.

Figure 12:
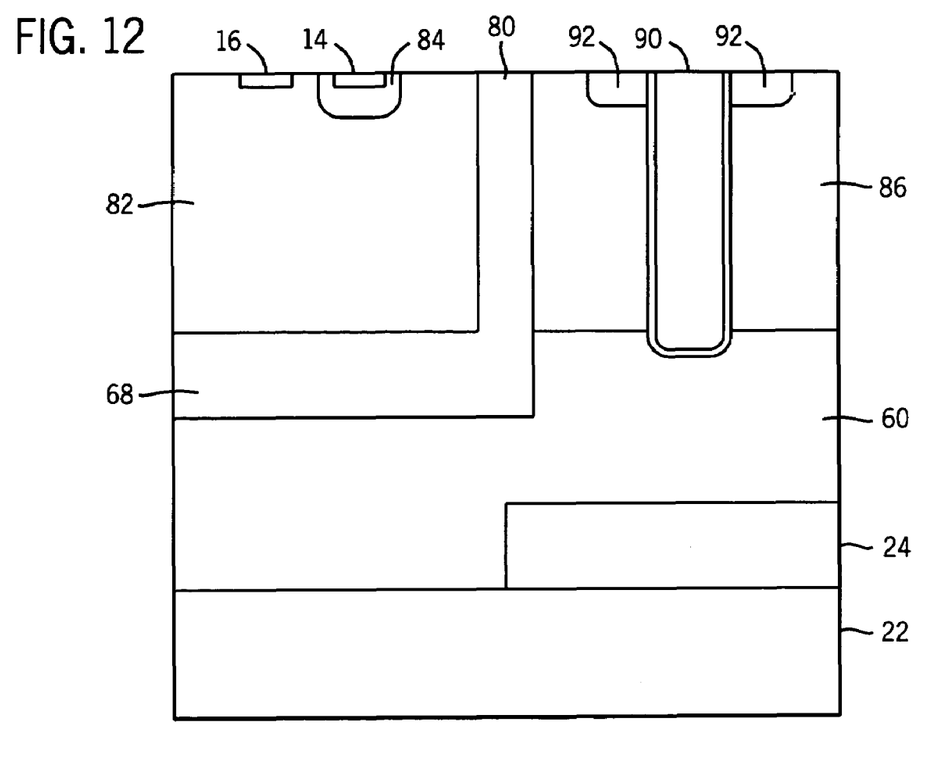

In FIG. 12, p-well 82 is implanted in polysilicon region 74 in the lateral driver device area for driver circuit 10. N-channel transistor 16 is formed in p-well 82. An N-well 84 is implanted in p-well 82 for p-channel transistor 14. A p-well 86 is implanted in N-epi region 76 in the vertical power device area for power MOSFET 12. A trench 90 is formed for the gate of power MOSFET 12 and source regions 92 are formed on both sides of trench 90. Substrate 22 is the drain of power MOSFET 12. When driver circuit 10 charges the gate of power MOSFET 12, a conduction path for current $I_{12}$ is created from source regions 92, vertically along trench 90, to the drain in substrate 22.

The offset 70 in the oxide layer 68, corresponding to offset 64, which in turn is determined by the thickness of N+ layer 24 and the depth of the etching process, creates the portion of the oxide isolation barrier under the lateral driver device area. The height of the offset 70 controls the thickness of the oxide layer under the later driver device area. The width of trench 80 determines the thickness of the sidewalls of the oxide isolation barrier. The oxide barrier provides isolation for driver circuit 10 from the electrical effects of power MOSFET 12.

The above principals are equally applicable to providing isolation between transistors 14 and 16 in driver circuit 10. An oxide-filled trench is formed around and between one or both of the transistors 14–16 extending down to the oxide layer 68 using process steps similar to those described above. The n-channel transistor would be dielectrically-isolated from the p-channel transistor. This would be particularly useful when implementing TFTs as the driver devices.

A person skilled in the art will recognize that changes can be made in form and detail, and equivalents may be substituted for elements of the invention without departing from the scope and spirit of the invention. The present description is therefore considered in all respects to be illustrative and not restrictive, the scope of the invention being determined by the following claims and their equivalents as supported by the above disclosure and drawings.

What is claimed is:

1. A method of forming a semiconductor device, comprising:
    providing a substrate;
    forming a first layer of semiconductor material over the substrate;
    removing a portion of the first layer to provide a layer offset between a removed portion of the first layer and a remaining portion of the first layer;
    forming an oxide layer of uniform thickness over the removed portion of the first layer and the remaining portion of the first layer;
    planarizing the oxide layer so that the oxide layer over the remaining portion of the first layer is removed;
    forming a polysilicon region over the planarized oxide layer;
    forming an epi region over the remaining portion of the first layer;
    forming a trench between the polysilicon region and. the api region extending vertically down to the oxide layer; and
    depositing oxide in the trench down to the oxide layer to isolate the polysilicon region.

2. The method of claim 1, wherein the substrate is N-type semiconductor material.

3. The method of claim 1, wherein the first layer of semiconductor material receives N-type dopants.

4. The method of claim 1, wherein the step of removing a portion of the first layer includes the step of removing the first layer substantially down to the substrate.

5. The method of claim 1, further including the steps of:
    forming a first well in the polysilicon region;
    forming a second well in the first well;
    forming a first transistor in the first well; and
    forming a second transistor in the second well.

6. The method of claim 5, further including the steps of:
forming a third well in the epi region; and
    forming a power transistor in the third well.

7. A method of forming an integrated circuit having a driver device in proximity to a power device, comprising:
    forming an oxide layer below the driver device;
    forming a trench between the driver device and the power device, wherein the trench extends down to the oxide layer;
    depositing oxide in the trench down to the oxide layer to isolate the driver device from the power device;
    providing a substrate;
    forming a first layer of semiconductor material over the substrate;
    removing a portion of the first layer to provide a layer offset between a removed portion of the first layer and a remaining portion of the first layer; and
    forming the oxide layer having uniform thickness over the removed portion of the first layer and the remaining portion of the first layer.

8. The method of claim 7, further including the steps of:
    planarizing the oxide layer so that the oxide layer over the remaining portion of the first layer is removed;
    forming a polysilicon region over the planarized oxide layer;
    forming an epi region over the remaining portion of the first layer; and
    forming the trench between the polysilicon region and the epi region egtending vertically down to the oxide layer.

9. The method of claim 8, wherein the first layer of semiconductor material is an extension layer of the substrate.

10. The method of claim 8, wherein the first layer of semiconductor material is an epi layer.

11. The method of claim 8, further including the steps of:
    forming a first well in the polysilicon region;
    forming a second well in the first well;
    forming a first transistor in the first well; and
    forming a second transistor in the second well.

12. The method of claim 11, further including the steps of:
forming a third well in the epi region; and forming a power transistor in the well.

13. A semiconductor device having a driver device in proximity to a power device, the semiconductor device being made by the process comprising the steps of:
    forming an oxide layer below the driver device;
    forming a trench between the driver device and the power device, wherein the trench extends down to the oxide layer;
    depositing oxide in the trench down to the oxide layer to isolate the driver device from the power device;
    providing a substrate;
    forming a first layer of semiconductor material over the substrate;
    removing a portion of the first layer to provide a layer offset between a removed portion of the first layer and a remaining portion of the first layer; and
    forming the oxide layer having uniform thickness over the removed portion of the first layer and the remaining portion of the first layer.

14. The semiconductor device of claim 13, wherein the process further includes the steps of:
    planarizing the oxide layer so that the oxide layer over the remaining portion of the first layer is removed;
    forming a polysilicon region over the planarized oxide layer;
    forming an epi region over the remaining portion of the first layer; and
    forming the trench between the polysilicon region and the epi region extending vertically down to the oxide layer.

15. A method of forming a first semiconductor device in proximity to a second semiconductor device on an integrated circuit, comprising:
    forming an oxide layer below the first semiconductor device;
    forming a trench between the first and second semiconductor devices, wherein the trench extends down to the oxide layer;
    depositing oxide in the trench down to the oxide layer to isolate the first and second semiconductor devices;
    providing a substrate;
    forming a first layer of semiconductor material over the substrate;

removing a portion of the first layer to provide a layer offset between a removed portion of the first layer and a remaining portion of the first layer; and forming the oxide layer having uniform thickness over the removed portion of the first layer and the remaining portion of the first layer.

16. The method of claim 15, further including the steps of:

planarizing the oxide layer so that the oxide layer over the remaining portion of the first layer is removed;

forming a polysilicon region over the planarized oxide layer;

forming an epi region over the remaining portion of the first layer; and forming the trench between the polysilicon region and the epi region extending vertically down to the oxide layer.

* * * * *

UNITED STATES PATENT AND TRADEMARK OFFICE
CERTIFICATE OF CORRECTION

PATENT NO. : 7,049,677 B2  
APPLICATION NO. : 10/767384  
DATED : May 23, 2006  
INVENTOR(S) : Badredin Fatemizadeh et al.

Page 1 of 1

It is certified that error appears in the above-identified patent and that said Letters Patent is hereby corrected as shown below:

On Title Page, Col. 2, change (74) Attorney, Agent or Firm name to read, --Robert D. Atkins; Quarles & Brady Streich Lang LLP--

Column 7, line 33, remove the "." between the words, "and" and "the"

Column 7, line 34, change the word, "api" to --epi--

Column 8, line 12, change the word, "egtending" to --extending--

Signed and Sealed this

Twenty-second Day of August, 2006

JON W. DUDAS  
*Director of the United States Patent and Trademark Office*